(12) United States Patent  
Mitchell

(10) Patent No.: US 8,587,461 B1
(45) Date of Patent: Nov. 19, 2013

(54) DATA ACQUISITION SYSTEM WITH ANALOG-TO-DIGITAL CONVERTER HAVING INTEGRATED MULTIPLEXER CONTROL

(75) Inventor: Jamaal Mitchell, Mountain View, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 71 days.

(21) Appl. No.: 13/283,514

(22) Filed: Oct. 27, 2011

(51) Int. Cl.
*H03M 1/66* (2006.01)

(52) U.S. Cl.
USPC .................. 341/141; 378/4; 378/19; 712/36; 327/142; 327/198; 327/231; 327/243; 327/553; 341/155; 341/140; 341/130

(58) Field of Classification Search
USPC .................. 341/130–172; 378/4, 19; 712/36; 327/142, 198, 231, 243, 553
See application file for complete search history.

(56) References Cited

U.S. PATENT DOCUMENTS

| | | | | |
|---|---|---|---|---|
| 5,208,545 A | * | 5/1993 | Schweitzer, III | 341/123 |
| 5,272,627 A | * | 12/1993 | Maschhoff et al. | 378/4 |
| 5,703,584 A | * | 12/1997 | Hill | 341/141 |
| 5,724,037 A | * | 3/1998 | Lee | 341/143 |
| 6,252,531 B1 | * | 6/2001 | Gordon et al. | 341/143 |
| 6,590,513 B2 | * | 7/2003 | Stetson et al. | 341/143 |
| 7,227,489 B2 | * | 6/2007 | Tryggvason et al. | 341/155 |
| 7,570,185 B2 | * | 8/2009 | Rao et al. | 341/138 |
| 7,760,123 B2 | * | 7/2010 | Rao et al. | 341/155 |
| 7,843,257 B2 | * | 11/2010 | Jones et al. | 327/553 |
| 7,876,252 B1 | * | 1/2011 | Wegener | 341/155 |
| 8,040,270 B2 | * | 10/2011 | Rao et al. | 341/172 |

OTHER PUBLICATIONS

Data Sheet, "MAXIM ± 18-Bit ADC with Serial Interface", pp. 1-16, Aug. 1995.

* cited by examiner

*Primary Examiner* — Lam T Mai
(74) *Attorney, Agent, or Firm* — TIPS Group

(57) ABSTRACT

A data acquisition system includes an analog-to-digital converter (ADC) having a MUX control outputs, a controller coupled to the ADC, a multiplexer coupled to the MUX control outputs of the ADC, and an operational amplifier coupling an analog data output of the multiplexer to an input of the ADC. An ADC having integrated multiplexer control includes control logic circuitry, ADC circuitry, MUX logic and an oscillator coupled to the control logic circuitry, the ADC circuitry, and the MUX logic.

17 Claims, 4 Drawing Sheets

DATA ACQUISITION SYSTEM WITH ANALOG-TO-DIGITAL CONVERTER HAVING INTEGRATED MULTIPLEXER CONTROL

BACKGROUND

An analog-to-digital converter (ADC) takes an analog input signal and converts the input, through a mathematical function, to a digital output signal. The ADC process includes the steps of: 1) sampling an analog signal; 2) quantizing the sampled signal; and 3) digitally encoding the quantized signal. There are many methods for implementing an ADC process as is well known to those of skill in the art.

There are numerous multi-channel ADC applications that utilize a multiplexer (MUX) followed by an ADC or an operational amplifier (op amp) and an ADC. For the proper operation of such data acquisition systems, the MUX control signals must be carefully timed with respect to a control signal which initiates ADC signal acquisition and conversion. Typically, a controller separate from the other components of the data acquisition system was responsible for system timing issues, such as to when to switch channels on the MUX.

Designers of data acquisition systems as described above consider a number of design issues including the optimization of analog signal path performance and control, reducing timing complexity, and improving analog isolation. These have been difficult problems to solve since system designers don't have reliable information as to the various delays within the system. For example, the controller doesn't have internal information of the ADC, such as when data capture is completed. As a result, system designers build-in additional time between data capture requests from the controller in order to compensate for delays in the system and to ensure sufficient analog signal path slew and settle time. This, in turn, reduces the resolution and capacity of the data acquisition system.

These and other limitations of the prior art will become apparent to those of skill in the art upon a reading of the following descriptions and a study of the several figures of the drawing.

SUMMARY

By way of example and not limitation, a data acquisition system includes: an analog-to-digital converter having at least one analog input, a control input, a clock input, a digital data output and a number of MUX control outputs; a controller coupled to the number of control inputs, the clock input and the digital data output of the analog-to-digital converter; a multiplexer coupled to the number of MUX control outputs of the analog-to-digital converter and having an analog data output; and an operational amplifier coupling the analog data output of the multiplexer to the analog input of the analog-to-digital controller. Advantageously, the analog signal path performance and control is improved, timing complexity is reduced since the controller is no longer responsible for MUX control, and analog isolation is improved.

By way of additional example and not limitation, an analog-to-digital converter having integrated multiplexer control includes: control logic circuitry having a digital data input, a control input, a clock input and a digital data output; ADC circuitry having a pair of analog inputs and a digital data output coupled to the digital data input of the control logic circuitry; MUX logic having a number of MUX control outputs; and an oscillator coupled to the control logic circuitry, the ADC circuitry, and the MUX logic. Advantageously, the combination of the ADC with the multiplexer control allows for more efficient operation of the multiplexer and facilitates improved amplifier slew-and-settle performance.

By way of further example and not limitation, a method for operating a data acquisition system includes: programming registers of an analog-to-digital converter device having integrated multiplexer control with a data sampling sequence; providing a convert signal to the analog-to-digital converter device; and outputting from the analog-to-digital converter device MUX control outputs in accordance with the data sampling sequence.

It will be appreciated that, in certain example embodiments, analog front end (AFE) circuitry is integrated with ADC circuitry. An advantage of such embodiments is that external MUX control signals can be synchronized with an ADC acquisition and control signal allowing the automatic management of sensitive timing control between a MUX and the ADC circuitry.

It will be further appreciated that certain example embodiments are well suited for multi-channel data conversion applications where analog signal path performance and control tend to be important. By way of non-limiting examples, embodiments can advantageously improve operational amplifier slew and settle time, reduce timing complexity between an ADC and a MUX, and improve analog isolation.

These and other embodiments, features and advantages will become apparent to those of skill in the art upon a reading of the following descriptions and a study of the several figures of the drawing.

BRIEF DESCRIPTION OF THE DRAWINGS

Several example embodiments will now be described with reference to the drawings, wherein like components are provided with like reference numerals. The example embodiments are intended to illustrate, but not to limit, the invention. The drawings include the following figures.

DETAILED DESCRIPTION OF EXAMPLE EMBODIMENTS

Figure 1:
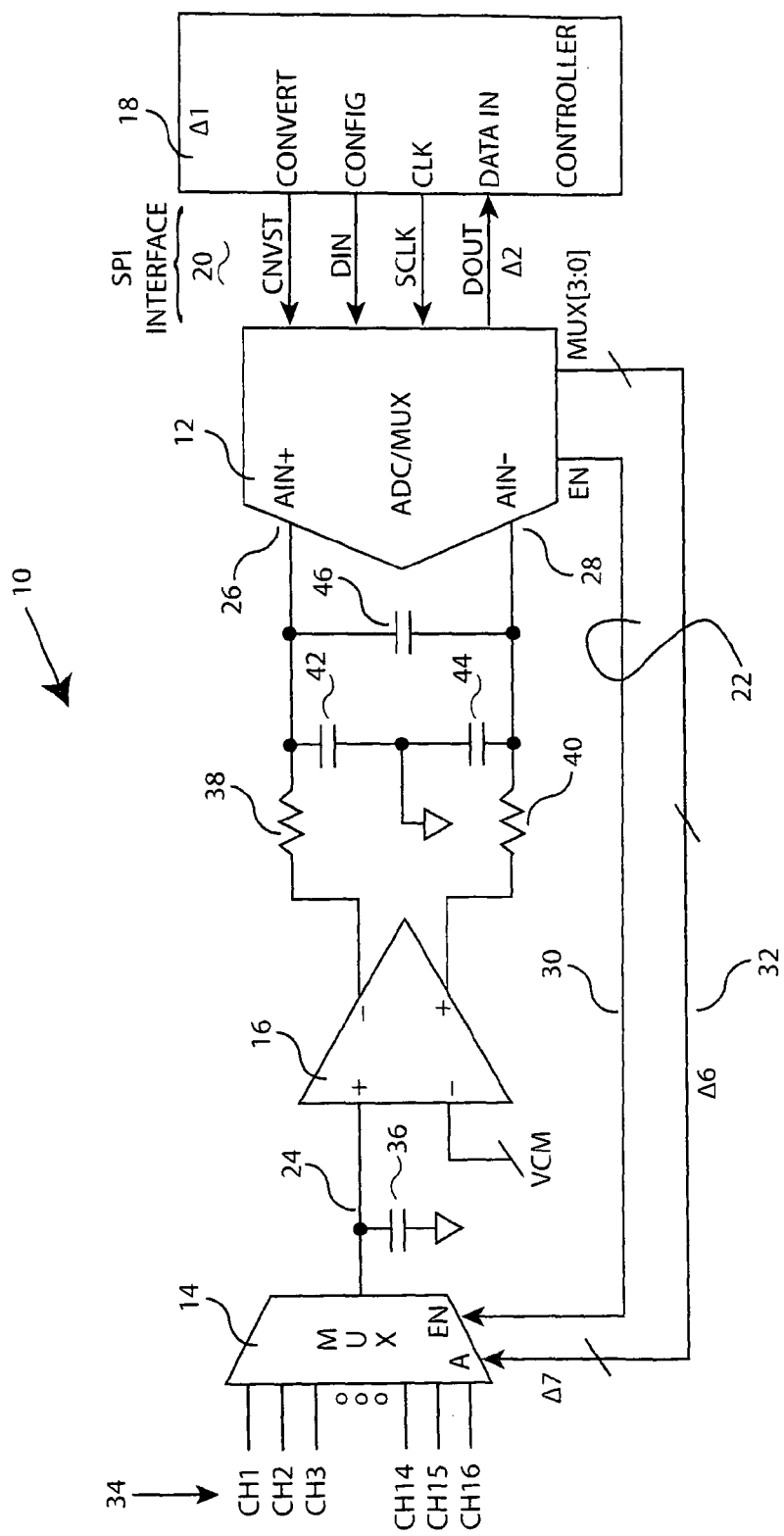
FIG. 1 is a block diagram of a data acquisition system.

FIG. 1 is a block diagram of a data acquisition system 10, set forth by way of example and not limitation, including an analog-to-digital converter with multiplexer control ("ADC/MUX") 12, a multiplexer ("MUX") 14, an operational amplifier ("Op Amp") 16 and a controller 18. The controller 18 is coupled to ADX/MUX 12 and can communicate by a Serial Peripheral Interface (SPI) bus 20, by way of non-limiting example. ADC/MUX 12 includes MUX control outputs 22 which are coupled to MUX 14. As will be discussed in more detail subsequently, Op Amp 16, in this non-limiting example, couples an analog data output 24 of the MUX 14 to a pair of analog inputs 26 and 28 of the ADC/MUX 12.

As noted previously, controller 18 and ADC/MUX can, in an example embodiment, communicate by SPI bus 20. The SPI bus is a synchronous serial data link de facto standard named by Motorola that operates in a full duplex mode. Devices communicate in a master/slave fashion where the master (controller 18 in this example) initiates the communication with the slave (ADC/MUX in this example). The SPI bus is sometimes alternatively referred to as a "four-wire" bus. Other bus configurations are also suitable, as will be appreciated by those of skill in the art. However, using a standard bus, such as the SPI bus, has advantages from a system designer's point of view.

In this example embodiment, SPI Bus 20 carries four signals between controller 18 and ADC/MUX 12, namely CNVST, DIN, SCLK and DOUT. The CNVST signal is a command to the ADC/MUX to convert an analog input signal into a digital output signal. The DIN signal is used by the controller 18 to configure the ADC/MUX, and is transmitted by a serial protocol. The SCLK signal provides the system clock of the controller 18 to the ADC/MUX 12 to synchronize the ADC/MUX 12 with the controller 18. The DOUT signal provides the digital data output of the ADC/MUX, and is also transmitted by a serial protocol.

ADC/MUX 12 also includes analog input (AIN+) 26 and analog input (AIN−) 28. In this non-limiting example, the analog inputs 26/28 comprise a differential pair. The ADC/MUX 12 further includes a plurality of MUX control outputs 22. In this non-limiting example, MUX control outputs 22 include an enable (EN) line 30 and a MUX address bus ("MUX[3:0]") 32. Since the MUX address bus 32 has four lines, up to sixteen channels of a multiplexer can be addressed. As will be appreciated by those of skill in the art, MUX address bus 32 can have fewer or more lines, depending upon the number of channels to be selected. For example, if only two channels are to be addressed, MUX address bus 32 would have only a single line, and if thirty-two channels are to be addressed, MUX address bus 32 would have at least five lines. However, since the enable line 30 is always required, ADC/MUX 12 will always have a plurality (e.g. two or more) MUX control outputs 22 comprising the enable line 30 and at least one line comprising the MUX address bus 32.

By way of non-limiting example, MUX 14 can be a sixteen channel, digitally controlled analog MUX with a single-ended analog data output 24. It will be appreciated by those of skill in the art that MUX 14 can have fewer or more channels, and that the MUX 14 could have a differential output rather than the single-ended output of this example. The example MUX 14 is digitally controlled by the MUX address bus 32 and the enable line 30 of the MUX control outputs 22 of the ADC/MUX 12. The MUX address bus 32, carrying four bits of information in parallel, can address the sixteen analog data input channels 34 (CH1, CH2, . . . C16, in this example) of MUX 14. The analog data output 24 will reflect analog input data at one of the channels 34 as selected by the address on the MUX address bus 32 after being enabled by the enable line 30. A shunt capacitor 36 can be used to shunt high-frequency components of the analog data output 24 signal to ground.

In this non-limiting example, the analog data output 24 is coupled to a positive ("+") input of Op Amp 16. The negative ("−") input of Op Amp 16 is coupled to a reference voltage VCM. A negative ("−") output of the Op Amp 16 is coupled to an input node of a current-limiting resistor 38 and a positive ("+") output of the Op Amp 16 is coupled to an input node of a current-limiting resistor 40. The positive and negative outputs of Op Amp 16, in this non-limiting example, may be considered as a differential pair. Of course, other operational amplifier configurations can be used, as will be appreciated by those of skill in the art.

Resistors 38 and 40 can be, for example, approximately 150Ω. In this example, shunt capacitors 42 and 44 couple output nodes of resistors 38 and 40 to ground to reduce high-frequency transients. By way of non-limiting example, shunt capacitors can be 0.4 nF capacitors. A capacitor 46 is coupled across the output nodes of resistors 38 and 40 to form a part of a filtering network with capacitors 42 and 44 and to quell charge injection vis-à-vis the analog-to-digital conversion circuitry. By way on non-limiting example, integrating capacitor 46 can be a 1 nF capacitor. Analog input 26 is coupled to the output node of the resistor 38 and analog input 28 of ADC/MUX 12 is coupled to the output node of resistor 40.

Controller 18 is preferably a digital control device such as a FPGA, microcontroller, etc. It can operate as a state machine, a digital processor, or otherwise as will be appreciated by those of skill in the art. In this example, controller 18 implements as SPI interface 20 in order to control ADC/MUX 12 and to receive serialized digital data output from the ADC/MUX 12. The various command signals generated by controller include configuration commands sent as a serialized DIN signal according to SPI interface protocols and a convert signal CNVST which instructs the ADC/MUX to capture and convert the analog signal at its input to a serialized digital output DOUT at its output. As will be appreciated by those of skill in the art, controller 18 may also be controlling other system functionality or may be performing other processes in addition to providing or receiving the aforementioned signals.

Figure 2:
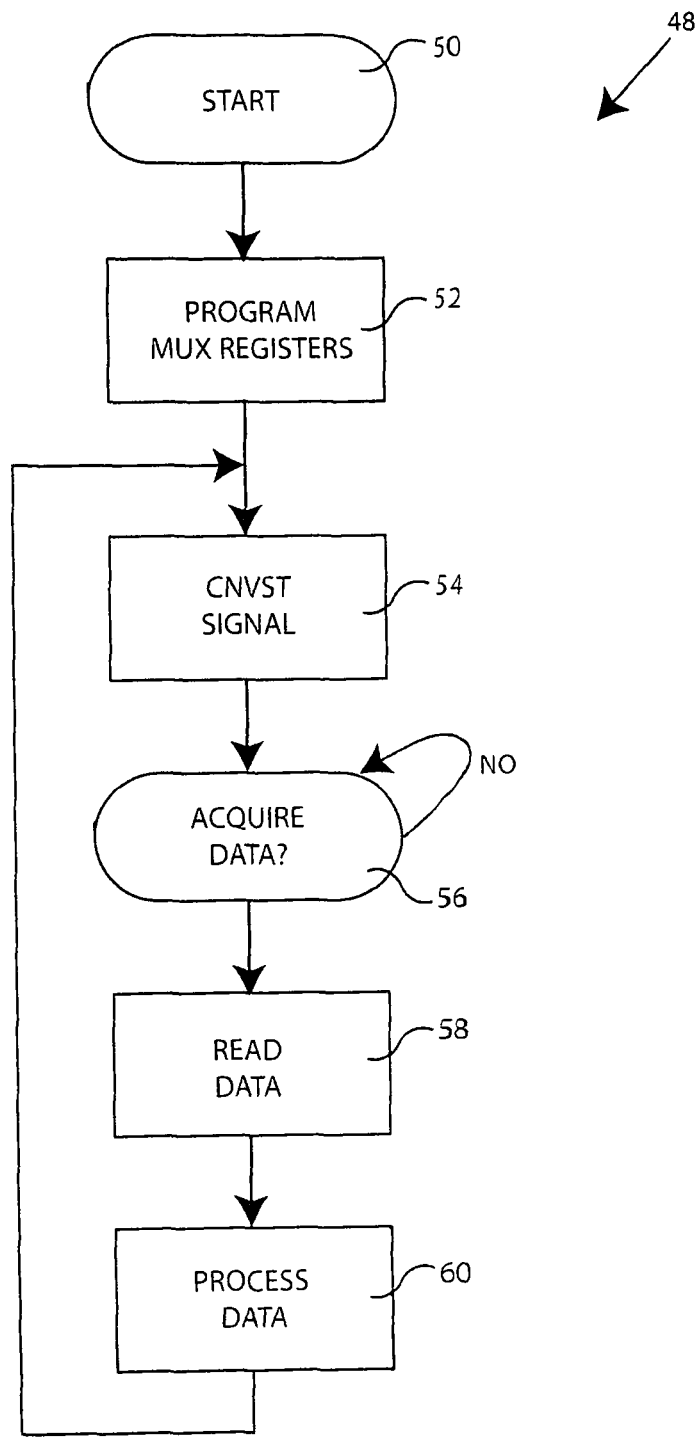
FIG. 2 is a flow diagram of a method for operating a data acquisition system.

FIG. 2 is a flow diagram, set forth by way of example and not limitation, of a process 48 which may be implemented by controller 18. Start operation 50 (e.g. power-up of the data acquisition system 10) begins the process 48 and an operation 52 programs MUX registers of the ADC/MUX 12. In this example, this is accomplished using the DIN signals to store MUX operating parameters in registers of the ADC/MUX 12. For example, operating parameters specifying the order and/or duration of channel selection for the MUX 14 can be programmed into registers of the ADC/MUX 12. It will be appreciated that concurrently with operation 52 that other registers of the ADC/MUX 12 can be programmed via DIN signals. By way of non-limiting examples, registers of the ADC/MUX 12 can be programmed to specify single-ended or fully differential multiplexer configurations, whether internal or external voltage references are to be use, alarm thresholds, etc., as will be appreciated by those of skill in the art.

By way of further non-limiting example, an operation 54 of process 48 a CNVST signal can then be sent by the controller 18 to the ADC/MUX 12. The CNVST signal causes the ADC/MUX 12 to begin to convert the analog data signals at its input to a serialized digital data output signal DOUT. The CNVST signal also initiates the ADC/MUX 12 control of the MUX 14, relieving the controller 18 of any responsibility for MUX 14 control.

Next, in the example process 48, an operation determines if DOUT is providing digital output data and if it wishes to acquire that data. If so, the data is read by the controller 18 in an operation 58 and may then be processed in an operation 60. Operational control is then returned to operation 54 for another CNVST signal to repeat the process.

Figure 3:
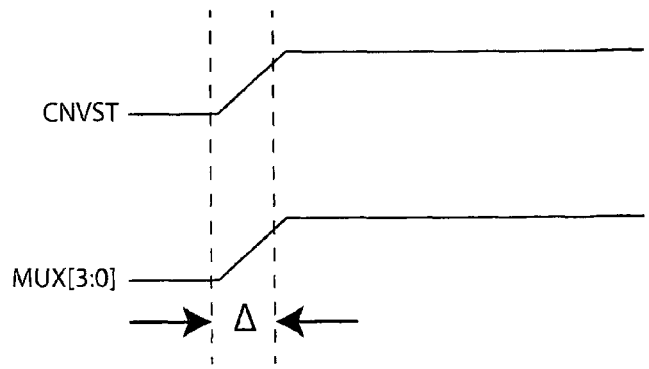
FIG. 3 is a timing diagram illustrating a phase relationship between a convert signal and a MUX control signal.

FIG. 3 is a timing diagram, set forth by way of example and not limitation, illustrating a phase relationship between a convert signal CNVST and the MUX[3:0] signal. As noted, the rising edge of the MUX[3:0] is triggered by the rising edge of the CNVST signal after a delay Δ. In certain example embodiments, the delay Δ is fixed, and in other example embodiments the delay Δ is variable. By way of non-limiting example, the delay Δ can be programmed by the controller 18 by writing to a register of the ADC/MUX 12 using a configuration signal DIN during an ADC/MUX 12 setup process.

Figure 4:
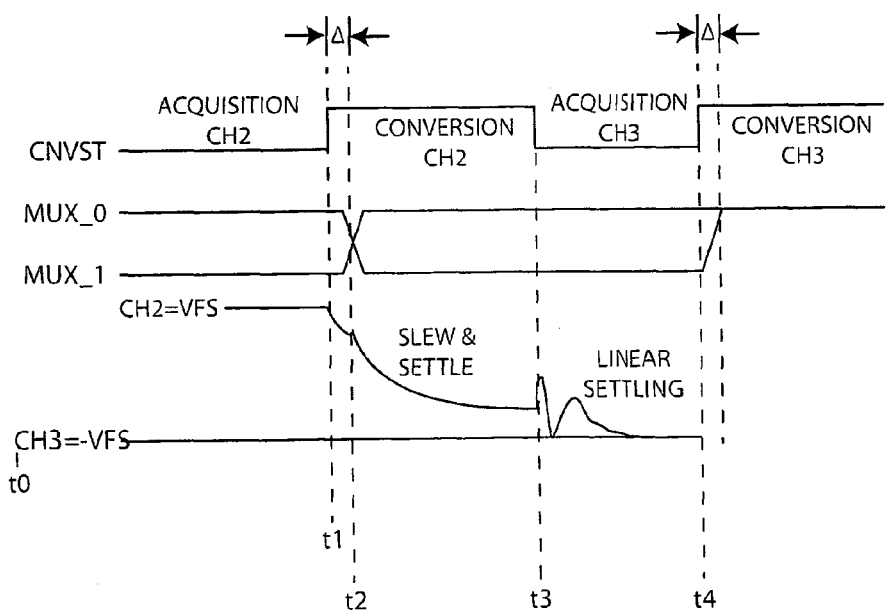
FIG. 4 is a timing and signal diagram illustrating a slew and settling phase of an operational amplifier after a convert signal.

FIG. 4 is a timing and signal diagram, set forth by way of example and not limitation, illustrating a slew and settling phase of Op Amp 16 after ADC/MUX 12 receives a convert signal CNVST and initiates a conversion of the analog data present on channel CH2 of the MUX 14, switches the MUX 14 from channel CH2 to channel CH3, and begins the acquisition of data on channel CH3 of MUX 14. In this example, only the two least significant bits of the MUX address lines 32 (MUX_0 and MUX_1) are shown.

With continuing reference to FIG. 4, at a time t0 the CNVST signal is LO, MUX_0 is HI, and MUX_1 is LO. As such, channel CH2 (i.e. MUX address 0001) is addressed, and acquisition of the analog data input of channel CH2 of MUX 14 is underway. For the purpose of this example, we will assume that channel CH2 is at a voltage level VFS (e.g. the reference voltage of the Op Amp 16) and that channel C3 is at −VFS to provide a worst-case scenario for the slew and settling of Op Amp 16 due to the switching of the MUX 14 from channel C2 to channel C3. At a time t1, the CNVST signal goes HI and, at time t2=t1+$\Delta$, the MUX address developed by ADC/MUX 12 changes to 0010, selecting channel C3 of MUX 14. During CNVST signal, which starts the conversion period for the analog data on channel C2, the Op Amp 16 goes through a "slew and settle" period, as illustrated.

At a time t3, the CNVST signal goes low, starting a data acquisition period for channel C3. As noted in FIG. 4, this causes the Op Amp 16 to go through some additional settling before going through a linear settling mode wherein the data on channel C3 is being accurately acquired. The process can then be repeated at a time t4 by raising the CNVST signal to HI, starting the conversion of the data on channel C3, and changing the channel on MUX 14, if desired.

Figure 5:
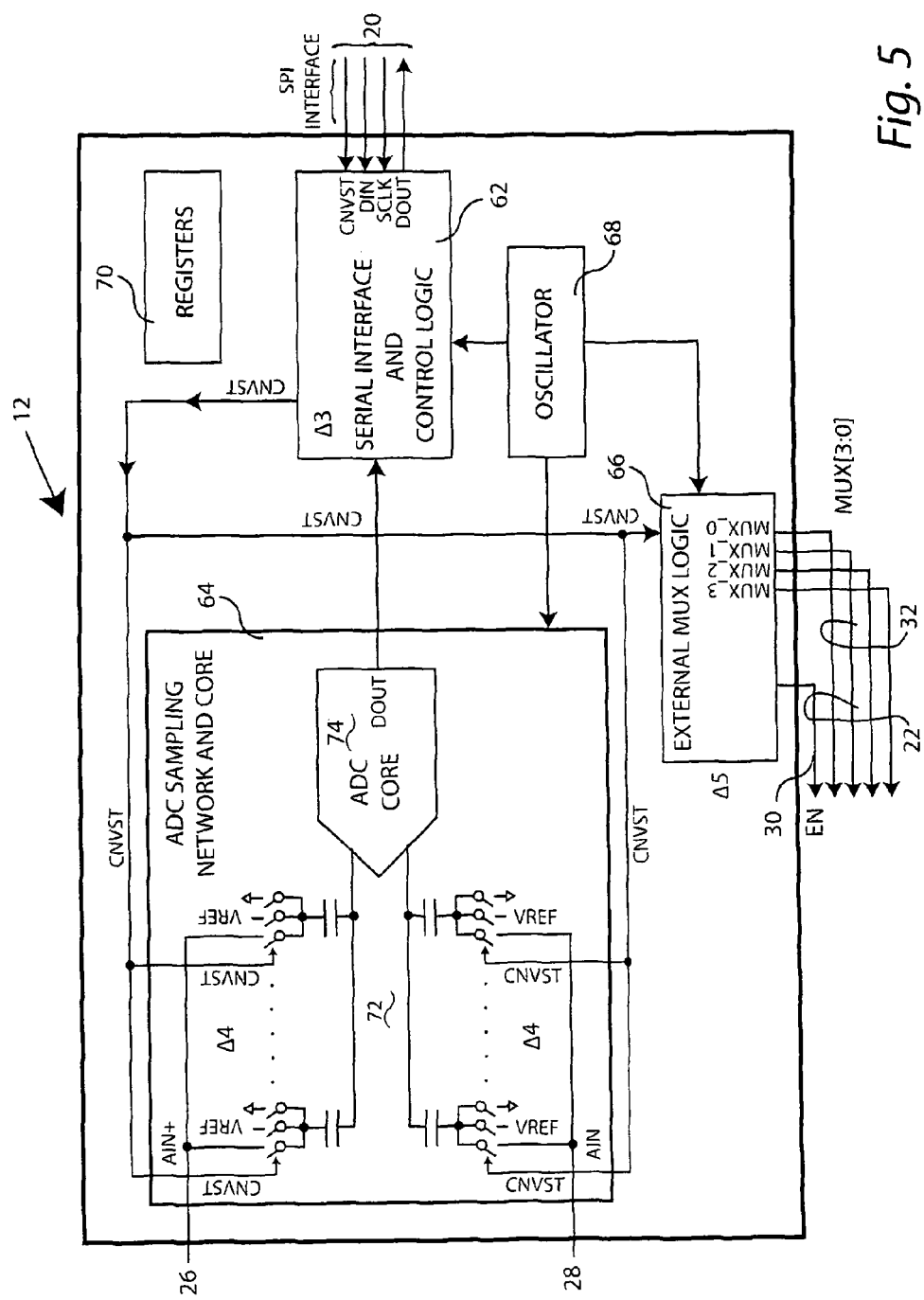
FIG. 5 is a block diagram of an analog-to-digital converter having integrated multiplex control.

FIG. 5 is a block diagram, set forth by way of example and not limitation, of and embodiment of ADC/MUX 12 of FIG. 1. In this example embodiment, ADC/MUX 12 includes a serial interface and control logic ("Control Logic") 62, an ADC sampling network and core ("ADC Circuit") 64, external MUX logic ("MUX Logic") 66, oscillator 68, and registers 70. As noted, an output of oscillator 68 is provided to each of Control Logic 62, ADC Circuit 64 and MUX Logic 68. Furthermore, the CNVST signal, which coordinates the operation of ADC/MUX 12, is applied to each of Control Logic 62, ADC Circuit 64 and MUX Logic 68.

Control Logic 62 provides the serial interface to the controller 18 (not seen). In this non-limiting example, an SPI interface 20 is supported. The Control Logic 62 also reads from and writes to registers 70 to provide for the programmability of the ADC/MUX 12 as described previously. Other portions of the ADC/MUX 12 can also have access to registers 70 (e.g. MUX Logic 66). Control Logic 62 furthermore provides the CNVST signal to the ADC Circuit 64 and the MUX Logic, as described above.

ADC Circuit 64 includes a sampling network 72 and an ADC core 74. The sampling network 72 is switched by the CNVST signal to provide sampled signals for the ADC core 74. The manufacture and operation of ADC cores, such as ADC core 74, are well known to those of skill in the art. The output DOUT of the ADC core 74 is coupled to an input of Control Logic 62 and forms the basis for the output DOUT of Control Logic 62.

MUX Logic 66 develops the MUX address bus 32 signals and the enable line 30 signal. MUX Logic 66 can use information stored in registers, such as registers 70, to determine, for example, the order and/or timing of channel selection for MUX 14. As described previously, in this example embodiment the MUX Logic is triggered by the CNVST signal, ensuring that the ADC Core has time to settle before new data acquisition commences without having to allocate excessive amounts of delay time.

(With reference to both FIGS. 1 and 5, several timing delays inherent in the data acquisition system 10 include timing delays in the controller 18 ("$\Delta 1$"), the SPI interface ("$\Delta 2$"), the Control Logic 62 ("$\Delta 3$"), the sampling network 72 ("$\Delta 4$"), the MUX Logic 66 ("$\Delta 5$"), the MUX address bus 32 ("$\Delta 6$"), and the decoder of the MUX 14 ("$\Delta 7$"). However, it will be appreciated that aperture delay uncertainty and variability is reduced because the ADC/MUX 12 can determine the time of acquisition of the analog data. Therefore, the delays of $\Delta 4$ and $\Delta 5$ can be aligned by output of the oscillator 68. In consequence, the data acquisition system 10 greatly reduces significant and variable timing uncertainty between the time of acquisition at $\Delta 4$ and issuance of a CNVST pulse before $\Delta 1$, where the total delay is equal to $\Delta 1+\Delta 2+\Delta 3+\Delta 4$. This is an important advantage to a system designer in that delays $\Delta 3$ and $\Delta 4$ are inherently unknowable.

Although various embodiments have been described using specific terms and devices, such description is for illustrative purposes only. The words used are words of description rather than of limitation. It is to be understood that changes and variations may be made by those of ordinary skill in the art without departing from the spirit or the scope of various inventions supported by the written disclosure and the drawings. In addition, it should be understood that aspects of various other embodiments may be interchanged either in whole or in part. It is therefore intended that the claims be interpreted in accordance with the true spirit and scope of the invention without limitation or estoppel.

What is claimed is:

1. A data acquisition system comprising:
   an analog-to-digital converter having at least one analog input, a plurality control inputs, a clock input, a digital data output and a plurality of MUX control outputs;
   a controller coupled to said plurality of control inputs, said clock input and said digital data output of said analog-to-digital converter;
   a multiplexer coupled to said plurality of MUX control outputs of said analog-to-digital converter and having an analog data output; and
   an operational amplifier coupling said analog data output of said multiplexer to said at least one analog input of said analog-to-digital converter.

2. A data acquisition system as recited in claim 1 wherein said at least one analog input includes a differential pair of analog inputs.

3. A data acquisition system as recited in claim 2 wherein said plurality control inputs is a convert signal input.

4. A data acquisition system as recited in claim 3 wherein said analog-to-digital converter further comprises a configuration signal input coupled to said controller.

5. A data acquisition system as recited in claim 4 wherein said MUX control outputs comprise a MUX enable output and a MUX switch output.

6. A data acquisition system as recited in claim 5 wherein said MUX switch output is one of a plurality of MUX switch outputs.

7. A data acquisition system as recited in claim 6 wherein said multiplexer has a single-ended output.

8. A data acquisition system as recited in claim 6 wherein said multiplexer has a differential output.

9. An analog-to-digital converter having integrated multiplexer control comprising:
   control logic circuitry having a digital data input, a control input, a clock input and a digital data output;
   ADC circuitry having at least one analog input and a digital data output coupled to said digital data input of said control logic circuitry;
   MUX logic having a plurality of MUX control outputs; and
   an oscillator coupled to said control logic circuitry, said ADC circuitry, and said MUX logic.

10. An analog-to-digital converter having integrated multiplexer control as recited in claim 9 wherein said control input is a convert signal input and wherein said convert signal input is coupled to said ADC circuitry and said MUX logic.

11. An analog-to-digital converter having integrated multiplexer control as recited in claim 10 wherein said ADC circuitry includes an ADC core and an ADC sampling network coupled to said control input.

12. An analog-to-digital converter having integrated multiplexer control as recited in claim 11 wherein said control logic circuitry further includes a configuration signal input.

13. An analog-to-digital converter having integrated multiplexer control as recited in claim 12 wherein said control logic circuitry further includes a serial interface for said configuration signal input and said digital data output.

14. A method for operating a data acquisition system comprising:
    programming registers of an analog-to-digital converter device having integrated multiplexer control with a data sampling sequence;
    providing a convert signal to said analog-to-digital converter device; and
    outputting from said analog-to-digital converter device MUX control outputs in accordance with said data sampling sequence.

15. A method for operating a data acquisition system as recited in claim 14 further comprising programming registers of said analog-to-digital converter device with ADC configuration information.

16. A method for operating a data acquisition system as recited in claim 15 further comprising applying said convert signal to an ADC sampling network of said analog-to-digital converter device.

17. A method for operating a data acquisition system as recited in claim 16 further comprising providing a serial digital data output from said analog-to-digital converter device.

* * * * *